United States Patent
Kuo et al.

(10) Patent No.: US 11,374,326 B2
(45) Date of Patent: Jun. 28, 2022

(54) PRINTED ANTENNA WITH PIN HEADER AND ELECTRONIC DEVICE HAVING THE SAME

(71) Applicant: ARCADYAN TECHNOLOGY CORPORATION, Hsinchu (TW)

(72) Inventors: Shin-Lung Kuo, Kaohsiung (TW); Shih-Chieh Cheng, Tainan (TW)

(73) Assignee: ARCADYAN TECHNOLOGY CORPORATION, Hsinchu (TW)

( * ) Notice: Subject to any disclaimer, the term of this patent is extended or adjusted under 35 U.S.C. 154(b) by 409 days.

(21) Appl. No.: 16/595,717

(22) Filed: Oct. 8, 2019

(65) Prior Publication Data

US 2020/0119448 A1    Apr. 16, 2020

(30) Foreign Application Priority Data

Oct. 11, 2018  (TW) ................................. 107135687

(51) Int. Cl.
| | | |
|---|---|---|
| *H01Q 9/04* | (2006.01) | |
| *H04B 7/0413* | (2017.01) | |
| *H05K 1/16* | (2006.01) | |

(52) U.S. Cl.
CPC ........... *H01Q 9/045* (2013.01); *H04B 7/0413* (2013.01); *H05K 1/16* (2013.01); *H05K 2201/10098* (2013.01)

(58) Field of Classification Search
CPC ............... H01Q 9/04; H04B 7/04; H05K 1/16
USPC .......................................................... 343/720
See application file for complete search history.

(56) References Cited

U.S. PATENT DOCUMENTS

2011/0122039 A1* 5/2011 Baba ........................ H01Q 9/20
                                                           343/810

FOREIGN PATENT DOCUMENTS

JP            2002135036       *  5/2002  ............... H01Q 3/44

* cited by examiner

*Primary Examiner* — Andrea Lindgren Baltzell
(74) *Attorney, Agent, or Firm* — Locke Lord LLP; Tim Tingkang Xia, Esq.

(57) ABSTRACT

An antenna with pin header is provided, which may include a substrate, a feed point, a radiator and a metallic pin header. The feed point may be disposed on the substrate. The radiator may be printed on the substrate and connected to the feed point. The metallic pin header may penetrate through the radiator and the substrate. The metallic pin header may be connected to the feed point via the radiator, and the radiator and the metallic pin header may have a common feedline, whereby the metallic pin header can enhance the gain pattern, in the direction which the metallic pin header points in, of the radiator.

14 Claims, 7 Drawing Sheets

PRINTED ANTENNA WITH PIN HEADER AND ELECTRONIC DEVICE HAVING THE SAME

CROSS REFERENCE TO RELATED APPLICATION

All related applications are incorporated by reference. The present application is based on, and claims priority from, Taiwan Application Serial Number 107135687, filed on Oct. 11, 2018, the disclosure of which is hereby incorporated by reference herein in its entirety.

TECHNICAL FIELD

The technical field relates to a printed antenna, in particular to a printed antenna with metallic pin header. The technical field further relates to an electronic device having the printed antenna.

BACKGROUND

A massive MIMO system needs a lot of antennas. However, as the internal spaces of electronic devices are limited, so how to install the antennas in an electronic device as many as possible has become an important issue.

Printed antennas can be directly printed on the surface of a circuit board, but the area of the circuit board is limited, so it is hard to install enough printed antennas capable of satisfying the requirements of massive MIMO systems.

Besides, as printed antennas are hard to generate vertically polarized waves, so tend to result in high peak gain. Moreover, the gain patterns of printed antennas are also hard to adjust. Thus, printed antennas are not suitable for massive MIMO systems.

Further, printed antennas cannot be disposed at the center of a circuit board because these antennas cannot effectively radiate when being surrounded by other electronic components. Thus, printed antennas cannot effectively make the most of the area of the circuit board.

Meandered inverted-F antennas (MIFA) can achieve greater performance, but these antennas need higher manufacturing cost, so are not suitable for massive MIMO systems.

Wall-mounted antennas also can achieve greater performance, but these antennas may block the ventilation holes of electronic devices, which influence the heat dissipation of the electronic devices. Besides, these antennas need longer RF cables, which result in higher cable loss and noise. Therefore, wall-mounted antennas are also not suitable for massive MIMO systems.

Thus, is has become an important issue to provide an antenna capable of improving the above problems of currently available antennas.

SUMMARY

An embodiment of the disclosure relates to a printed antenna with pin header, which may include a substrate, a feed point, a radiator and a metallic pin header. The feed point may be disposed on the substrate. The radiator may be printed on the substrate and connected to the feed point. The metallic pin header may penetrate through the radiator and the substrate. The metallic pin header may be connected to the feed point via the radiator, and the radiator and the metallic pin header may have a common feedline, whereby the metallic pin header can enhance the gain pattern, in the direction which the metallic pin header points in, of the radiator.

In a preferred embodiment of the disclosure, the metallic pin header may be perpendicular to the substrate.

In a preferred embodiment of the disclosure, the metallic pin header may be disposed at one end, most away from the feed point, of the radiator.

In a preferred embodiment of the disclosure, the radiator may include a first portion, a second portion and a third portion. The first portion may be rectangular, the second portion may be trapezoidal and the third portion may be sectorial. The second portion may be connected to the first portion and the third portion, and a recess may be formed between the first portion, the second portion and the third portion.

In a preferred embodiment of the disclosure, the metallic pin header may be disposed at one end, away from the second portion, of the first portion.

Another embodiment of the disclosure relates to a printed antenna with pin header, which may include a substrate, a feed point, a first radiator and a metallic pin header. The feed point may be disposed on the substrate. The radiator may be printed on the substrate and connected to the feed point. The metallic pin header may penetrate through the substrate and disposed at one side of the radiator, not contacting the radiator.

The metallic pin header can enhance the gain pattern, in the direction away from the metallic pin header, of the first radiator.

In a preferred embodiment of the disclosure, the metallic pin header may be perpendicular to the substrate.

In a preferred embodiment of the disclosure, the radiator may include a first portion, a second portion and a third portion. The first portion may be rectangular, the second portion may be trapezoidal and the third portion may be sectorial. The second portion may be connected to the first portion and the third portion, and a recess may be formed between the first portion, the second portion and the third portion.

In a preferred embodiment of the disclosure, the first portion and the third portion may extend in the direction away from the metallic pin header.

In a preferred embodiment of the disclosure, the printed antenna may further include a second radiator. The metallic pin header may be disposed between the first radiator and the second radiator in order to enhance the isolation between the first radiator and the second radiator.

Still another embodiment of the disclosure relates to an electronic device, which may include a housing and a printed antenna disposed inside the housing. The printed antenna may include a substrate, a feed point, a first radiator and a first metallic pin header. The feed point may be disposed on the substrate. The first radiator may be printed on the substrate and connected to the feed point. The first metallic pin header may penetrate through the first radiator and the substrate. The first metallic pin header may be connected to the feed point via the first radiator, and the first radiator and the first metallic pin header may have a common feedline. The first metallic pin header can enhance the gain pattern, in the direction which the first metallic pin header points in, of the first radiator.

In a preferred embodiment of the disclosure, the first metallic pin header may be perpendicular to the substrate.

In a preferred embodiment of the disclosure, the first metallic pin header may be disposed at one end, most away from the feed point, of the first radiator.

In a preferred embodiment of the disclosure, the first radiator may include a first portion, a second portion and a third portion. The first portion may be rectangular, the second portion may be trapezoidal and the third portion may be sectorial. The second portion may be connected to the first portion and the third portion, and a recess may be formed between the first portion, the second portion and the third portion.

In a preferred embodiment of the disclosure, the first metallic pin header may be disposed at one end, away from the second portion, of the first portion.

In a preferred embodiment of the disclosure, the printed antenna may further include a second metallic pin header penetrating through the substrate and disposed at one side of the first radiator, not contacting the first radiator. The second metallic pin header can enhance the gain pattern, in the direction away from the second metallic pin header, of the first radiator.

In a preferred embodiment of the disclosure, the printed antenna may further include a second radiator disposed between the first radiator and the second radiator in order to enhance the isolation between the first radiator and the second radiator, and the gain pattern, in the direction away from the second metallic pin header, of the second radiator.

The printed antenna with pin header and the electronic device having the same in accordance with the embodiments of the disclosure may have one or more than one of the following advantages:

(1) In one embodiment of the disclosure, the printed antenna has a metallic pin header, which can effectively improve the performance of the printed antenna and reduce the size of the printed antenna. Thus, a circuit board can be installed with a lot of the printed antennas, which can satisfy the requirements of massive MIMO system.

(2) In one embodiment of the disclosure, the metallic pin header and the radiator of the printed antenna can be connected to each other, and have a common feedline, which can achieve the desired technical effect without increasing the complexity of the printed antenna.

(3) In one embodiment of the disclosure, the metallic pin header of the printed antenna can effectively improve the performance of the printed antenna, so the printed antenna can be directly disposed at the center of a circuit board. Therefore, the printed antenna can effectively make the most of the area of the circuit board.

(4) In one embodiment of the disclosure, when the metallic pin header is connected to the radiator of the printed antenna, the vertically polarized wave of the radiator can be effectively enhanced, which can prevent from high peak gain, and the gain pattern of the printed antenna can be easy to adjust.

(5) In one embodiment of the disclosure, when the metallic pin header is disposed at one side of the radiator but not contacting the radiator, the metallic pin header can enhance the polarized wave, in the direction away from the metallic pin header, of the radiator, so the gain pattern of the printed antenna can be easy to adjust.

(6) In one embodiment of the disclosure, when being disposed between two radiators, the metallic pin header of the printed antenna can enhance the isolation between the radiators of the printed antenna, so the radiators do not interfere with each other. Thus, the performance of the printed antenna can be significantly improved.

(7) In one embodiment of the disclosure, the performance of the printed antenna can be improved by the metallic pin header of small size and low cost, so the printed antenna will not block the ventilation holes of electronic devices and will not increase the manufacturing cost thereof. Therefore, the printed antenna can be applied to various electronic devices, such as access point, router, etc.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The disclosure will become more fully understood from the detailed description given herein below and the accompanying drawings which are given by way of illustration only, and thus are not limitative of the disclosure and wherein.

DETAILED DESCRIPTION

Figure 1:
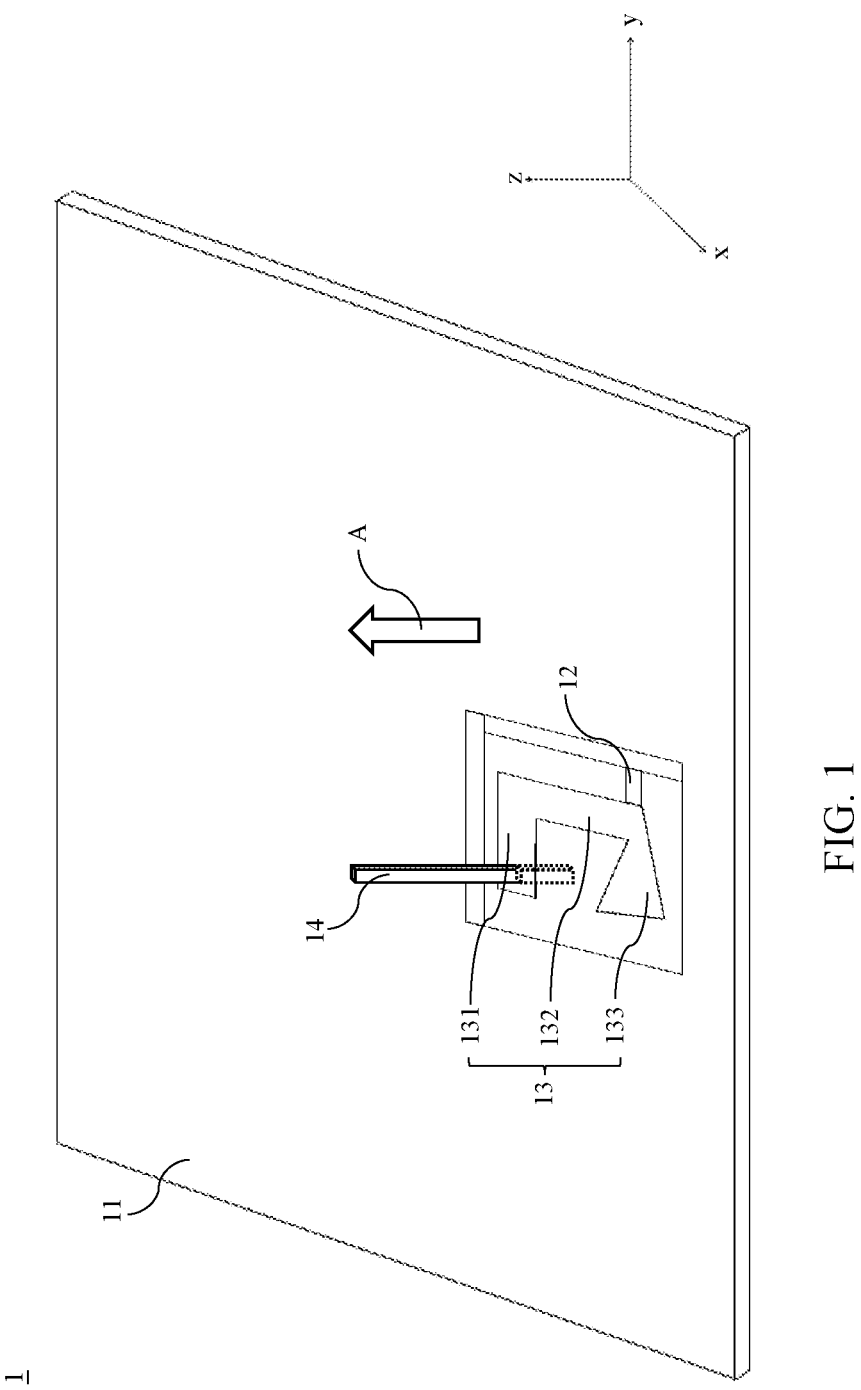
FIG. 1 is a perspective view of a printed antenna with pin header of a first embodiment in accordance with the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
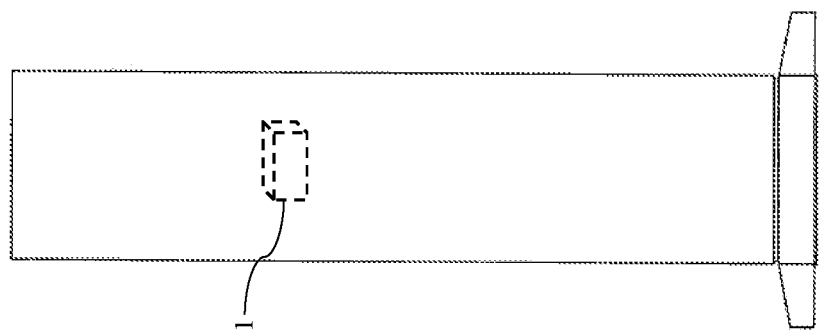
FIG. 2 is a perspective view of an electronic device of the first embodiment in accordance with the disclosure.

Please refer to FIG. 1 and FIG. 2; FIG. 1 is a perspective view of a printed antenna with pin header of a first embodiment in accordance with the disclosure; FIG. 2 is a perspective view of an electronic device of the first embodiment in accordance with the disclosure. As shown in FIG. 1, the printed antenna 1 includes a substrate 11, a feed point 12, a radiator 13 and a metallic pin header 14.

The feed point 12 is disposed on the substrate 11; in one embodiment, the substrate 11 may be a printed circuit board.

The radiator 13 is printed on the substrate 11 and connected to the feed point 12. The feed point 12, the radiator 13 and the metallic pin header 14 can serve as an antenna unit, and the printed antenna 1 may include one or more antenna units (some of antenna units may not include the metallic pin header). In the embodiment, the radiator 13 includes a first portion 131, a second portion 132 and a third portion 133. The first portion 131 is rectangular, the second portion 132 is trapezoidal and the third portion 133 is sectorial. The second portion 132 is connected to the first portion 131 and the third portion 133. The first portion 131 and the third portion 133 extend in the same direction, such that a recess is formed between the first portion 131, the second portion 132 and the third portion 133. The above structure is just for illustration instead of limitation; those skilled in the art can modify the structure of the radiator 13 according to actual requirements.

The metallic pin header 14 is disposed at one end, away from the second portion 132, of the first portion 131. The metallic pin header 14 penetrates through the radiator 13 and the substrate 11, such that one portion of the metallic pin header 14 protrudes from one side of the substrate 11 and the other portion of the metallic pin header 14 protrudes from the other side of the substrate 11. The metallic pin header 14 is connected to the feed point 12 via the radiator 13, so the radiator 13 and the metallic pin header 14 can have a common feedline. In the embodiment, the included angle between the metallic pin header 14 and the substrate 12 is 90° (the metallic pin header 14 is perpendicular to the substrate 11). In another embodiment, the included angle between the metallic pin header 14 and the substrate 11 may be modified in order to satisfy different requirements. In the embodiment, the metallic pin header 14 is disposed at one end, most away from the feed point 12, of the radiator 13. The metallic pin header 14 can provide an additional current path, so can enhance the gain pattern, in the direction which the metallic pin header 14 points in, of the radiator 13. In another embodiment, the metallic pin header 14 can be disposed at another position in order to satisfy different requirements. In the embodiment, the direction which the metallic pin header 14 points in is z-axis, so the metallic pin header 14 can enhance the vertically polarized wave of the radiator 13, as shown by the arrow A of FIG. 1. Thus, the printed antenna 1 with the metallic pin header 14 can prevent from high peak gain and the gain pattern of the printed antenna 1 can be easy to adjust.

As described above, as the metallic pin header 14 can effectively improve the performance of the printed antenna 1, the size of the printed antenna 1 can be reduced. Therefore, the substrate 11 can be installed with more printed antennas 1, which can satisfy the requirements of massive MIMO systems. As the metallic pin header 14 can significantly improve the performance of the printed antenna 1, so the printed antenna 1 can still effectively radiate even if the printed antenna 1 is disposed at the center of the substrate 11 and surrounded by other electronic components. Therefore, the printed antenna 1 can effectively make the most of the area of the substrate 11.

Besides, the performance of the printed antenna 1 can be obviously improved via the metallic pin header 14 of low cost, which can achieve the desired technical effect without significantly increasing cost.

Moreover, the metallic pin header 14 and the radiator 13 of the printed antenna 1 can be connected to each other, so can have a common feedline, which can achieve the desired technical effect without increasing the complexity of the printed antenna 1.

Furthermore, the performance of the printed antenna 1 can be obviously improved via the metallic pin header 14 of small size and the printed antenna 1 does not need long RF cables. Thus, the printed antenna 1 will not block the ventilation holes of electronic devices, and will not incur high cable loss and noise, so is very suitable for various network devices, such as the access point E shown in FIG. 2 or other different network devices (e.g. router). Thus, the printed antenna 1 of the embodiment can definitely improve the shortcomings of prior art.

The embodiment just exemplifies the disclosure and is not intended to limit the scope of the disclosure. Any equivalent modification and variation according to the spirit of the disclosure is to be also included within the scope of the following claims and their equivalents.

It is worthy to point out that currently available printed antennas can be directly printed on the surface of a circuit board, but the area of the circuit board is limited, so it is hard to install enough printed antennas capable of satisfying the requirements of massive MIMO systems. On the contrary, according to one embodiment of the disclosure, the printed antenna has a metallic pin header, which can effectively improve the performance of the printed antenna and reduce the size of the printed antenna. Thus, a circuit board can be installed with a lot of the printed antennas, which can satisfy the requirements of massive MIMO system. In addition, the metallic pin header and the radiator of the printed antenna can be connected to each other, and have a common feedline, which can achieve the desired technical effect without increasing the complexity of the printed antenna.

Also, currently available printed antennas cannot be disposed at the center of a circuit board because these antennas cannot effectively radiate when being surrounded by other electronic components. Thus, printed antennas cannot effectively make the most of the area of the circuit board. On the contrary, according to one embodiment of the disclosure, the metallic pin header of the printed antenna can effectively improve the performance of the printed antenna, so the printed antenna can be directly disposed at the center of a circuit board. Therefore, the printed antenna can effectively make the most of the area of the circuit board.

Besides, as currently available printed antennas are hard to generate vertically polarized waves, so tend to result in high peak gain. Moreover, the gain patterns of printed antennas are also hard to adjust. Thus, currently available printed antennas are not suitable for massive MIMO systems. On the contrary, according to one embodiment of the disclosure, when the metallic pin header is connected to the radiator of the printed antenna, the vertically polarized wave of the radiator can be effectively enhanced, which can prevent from high peak gain, and the gain pattern of the printed antenna can be easy to adjust.

Moreover, currently available meandered inverted-F antennas (MIFA) can achieve greater performance, but these antennas need higher manufacturing cost, so are not suitable for massive MIMO systems. On the contrary, according to one embodiment of the disclosure, the performance of the printed antenna can be improved by a metallic pin header of low cost, which will not obviously increase the cost of massive MIMO systems.

Furthermore, currently available wall-mounted antennas also can achieve greater performance, but these antennas may block the ventilation holes of electronic devices, which influence the heat dissipation of the electronic devices. Besides, these antennas need longer RF cables, which result in higher cable loss and noise. Therefore, wall-mounted antennas are also not suitable for massive MIMO systems. On the contrary, according to one embodiment of the disclosure, the performance of the printed antenna can be improved by the metallic pin header of small size, and the printed antenna does not need long RF cables. Therefore, the printed antenna will not block the ventilation holes of electronic devices, and will not incur high cable loss and noise.

Figure 3A:
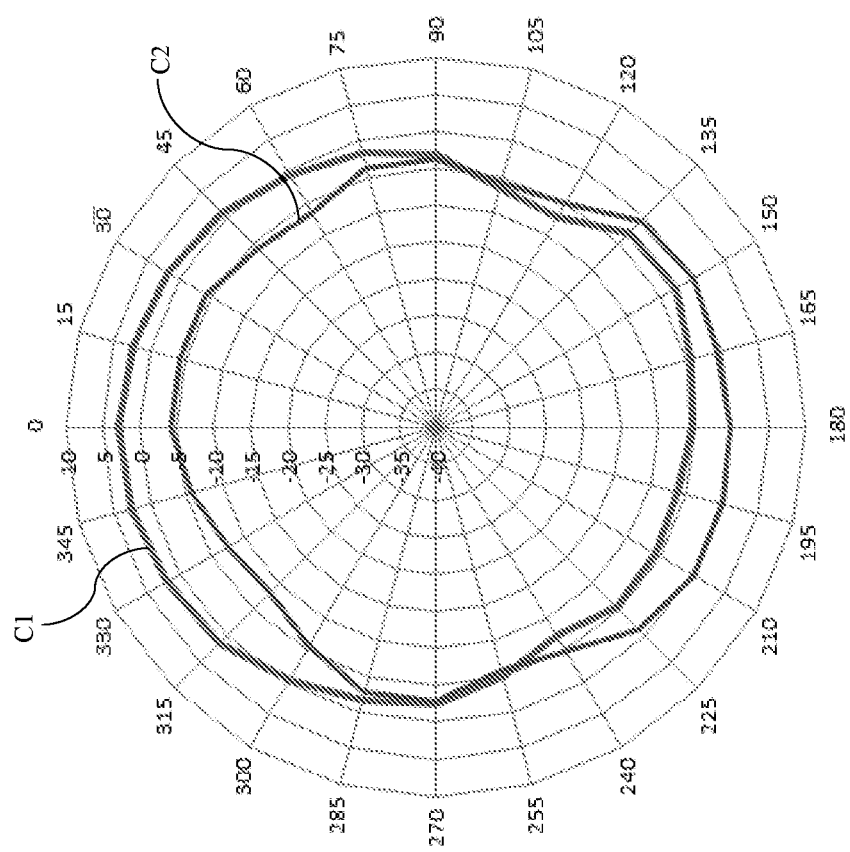
FIG. 3A~FIG. 3B are experimental results of the first embodiment in accordance with the disclosure.
Figure 3B:
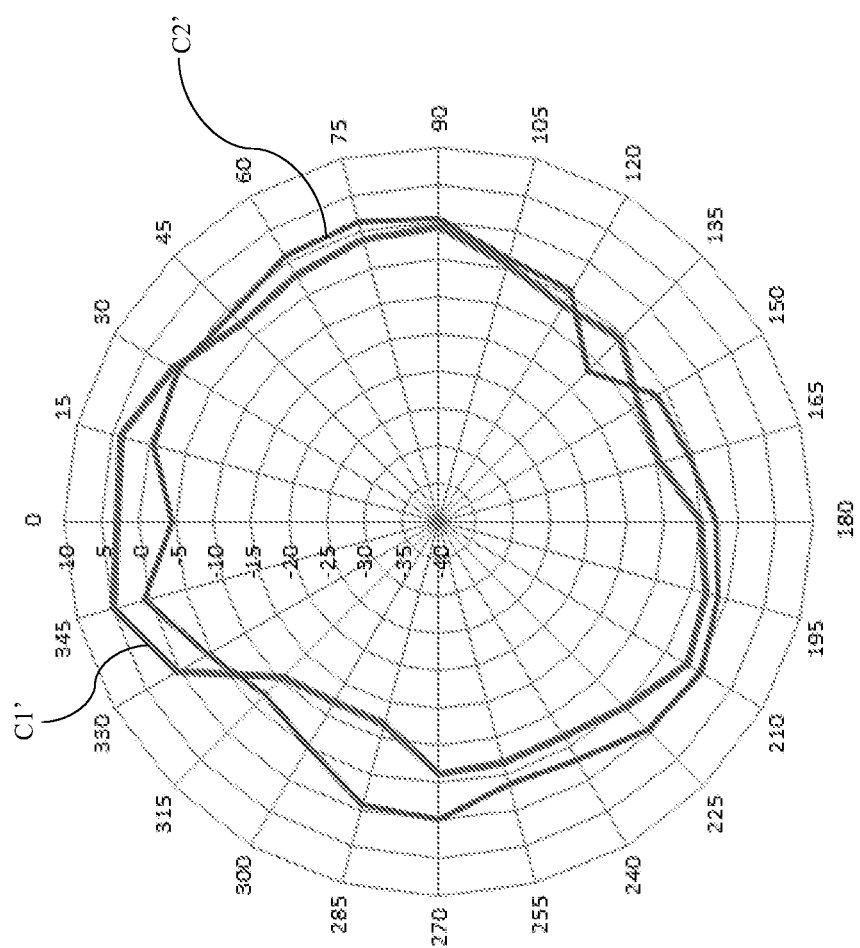

Please refer to FIG. 3A and FIG. 3B, which are experimental results of the first embodiment in accordance with the disclosure. The curve C1 shows the gain pattern, in XZ plane, of the printed antenna 1 with the metallic pin header 14; the curve C1' shows the gain pattern, in YZ plane, of the printed antenna 1 with the metallic pin header 14. The curve C2 shows the gain pattern, in XZ plane, of the printed antenna without the metallic pin header 14; the curve C2' shows the gain pattern, in YZ plane, of the printed antenna without the metallic pin header 14. As shown in FIG. 3A and FIG. 3B, the printed antenna 1 with the metallic pin header 14 can obviously achieve greater performance.

Figure 4:
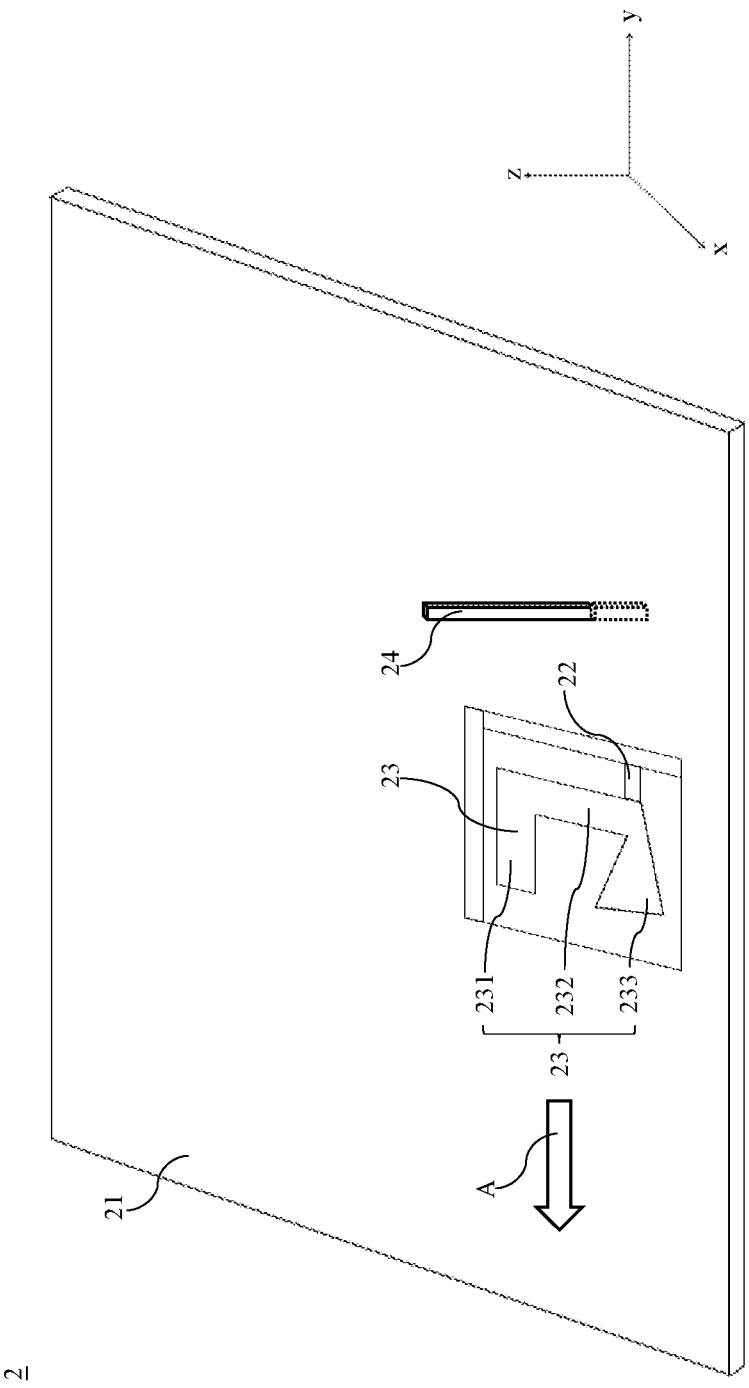
FIG. 4 is a perspective view of a printed antenna with pin header of a second embodiment in accordance with the disclosure.

Please refer to FIG. 4, which is a perspective view of a printed antenna with pin header of a second embodiment in accordance with the disclosure. As shown in FIG. 4, the printed antenna 2 includes a substrate 21, a feed point 22, a radiator 23 and a metallic pin header 24.

The feed point 22 is disposed on the substrate 21.

The radiator 23 is printed on the substrate 21 and connected to the feed point 22. The feed point 22 and the radiator 23 can serve as an antenna unit, and the printed antenna 2 may include one or more antenna units (some of antenna units may further include a metallic pin header). The radiator 23 includes a first portion 231, a second portion 232 and a third portion 233; the structure of the radiator 23 is similar to that of the previous embodiment, so will not be described herein again.

The metallic pin header 24 penetrates through the substrate 21, such that one portion of the metallic pin header 24 protrudes from one side of the substrate 21 and the other portion of the metallic pin header 24 protrudes from the other side of the substrate 21. The metallic pin header 14 is disposed at one side of the radiator 23 without contacting the radiator 23, and the first portion 231 and the third portion 233 of the radiator 23 extend in the direction away from the metallic pin header 24. In the embodiment, the included angle between the metallic pin header 24 and the substrate 22 is 90° (the metallic pin header 24 is perpendicular to the substrate 21). In another embodiment, the included angle between the metallic pin header 24 and the substrate 21 may be modified in order to satisfy different requirements.

As described above, in the embodiment, the metallic pin header 24 is disposed at one side of the radiator 23 of the printed antenna 2, which can enhance the gain pattern, in the direction away from the metallic pin header 14, of the radiator 23, as shown by the arrow A shown in FIG. 4. Thus, the position of the metallic pin header 24 can be flexibly changed, so the gain pattern of the printed antenna 2 can be easy to adjust.

The embodiment just exemplifies the disclosure and is not intended to limit the scope of the disclosure. Any equivalent modification and variation according to the spirit of the disclosure is to be also included within the scope of the following claims and their equivalents.

Figure 5:
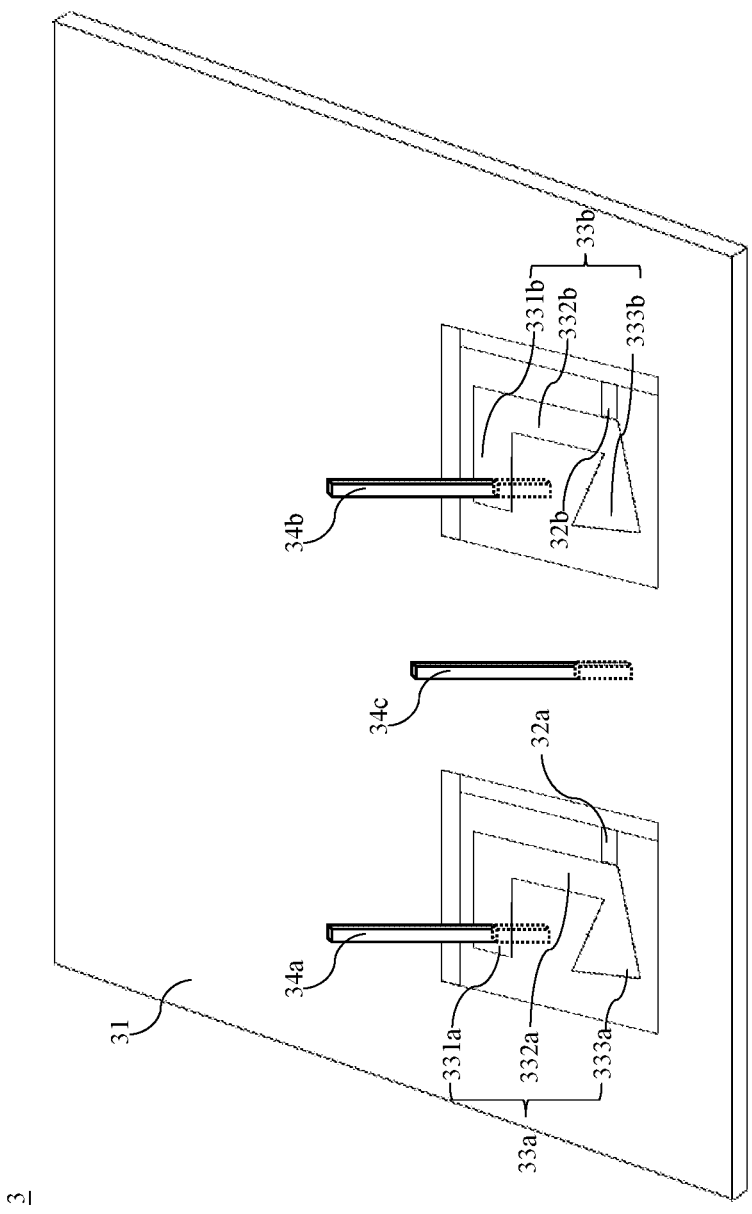
FIG. 5 is a perspective view of a printed antenna with pin header of a third embodiment in accordance with the disclosure.

Please refer to FIG. 5, which is a perspective view of a printed antenna with metallic pin header of a third embodiment in accordance with the disclosure. As shown in FIG. 5, the printed antenna 3 includes a substrate 31, a first feed point 32a, a first radiator 33a, a first metallic pin header 34a, a second feed point 32b, a second radiator 33b and a second metallic pin header 34b.

The first feed point 32a, the first radiator 33a and a first metallic pin header 34a can serve as an antenna unit. The first radiator 33a is printed on the substrate 31 and connected to the first feed point 32a. The first radiator 33a includes a first portion 331a, a second portion 332a and a third portion 333a. The first portion 331a is rectangular, the second portion 332a is trapezoidal and the third portion 333a is sectorial. The second portion 332a is connected to the first portion 331a and the third portion 333a. The first portion 331a and the third portion 333a extend in the same direction, such that a recess is formed between the first portion 331a, the second portion 332a and the third portion 333a.

The first metallic pin header 34a penetrates through the first radiator 33a and the substrate 31, and is connected to the first feed point 32a via the first radiator 33a, so the first radiator 33a and the first metallic pin header 34a can have a common feedline. The first metallic pin header 34a can enhance the gain pattern, in the direction which the first metallic pin header 34a points in, of the first radiator 33a.

The second feed point 32b, the second radiator 33b and a second metallic pin header 34b can serve as another antenna unit. The second radiator 33b is printed on the substrate 31 and connected to the second feed point 32b. The second radiator 33b also includes a first portion 331b, a second portion 332b and a third portion 333b; the structure of the second radiator 33b is similar to that of the first radiator 33a, so will not be described herein again. The second metallic pin header 34b penetrates through the second radiator 33b and the substrate 31, and is connected to the second feed point 32b via the second radiator 33b, so the second radiator 33b and the second metallic pin header 34b can have a common feedline. The second metallic pin header 34b can enhance the gain pattern, in the direction which the second metallic pin header 34b points in, of the second radiator 33b.

In the embodiment, the printed antenna 3 can further include a third metallic pin header 34c, which is disposed between the first radiator 33a and the second radiator 33b without contacting the first radiator 33a and the second radiator 33b. when being disposed between the first radiator 33a and the second radiator 33b, the third metallic pin header 34c can provide great isolation effect between the first radiator 33a and the second radiator 33b. In this way, the isolation between the first radiator 33a and the second radiator 33b can be further enhanced, so the first radiator 33a and the second radiator 33b will not be interfered with each other, which can significantly improve the performance of the printed antenna 3.

The embodiment just exemplifies the disclosure and is not intended to limit the scope of the disclosure. Any equivalent modification and variation according to the spirit of the disclosure is to be also included within the scope of the following claims and their equivalents.

Figure 6:
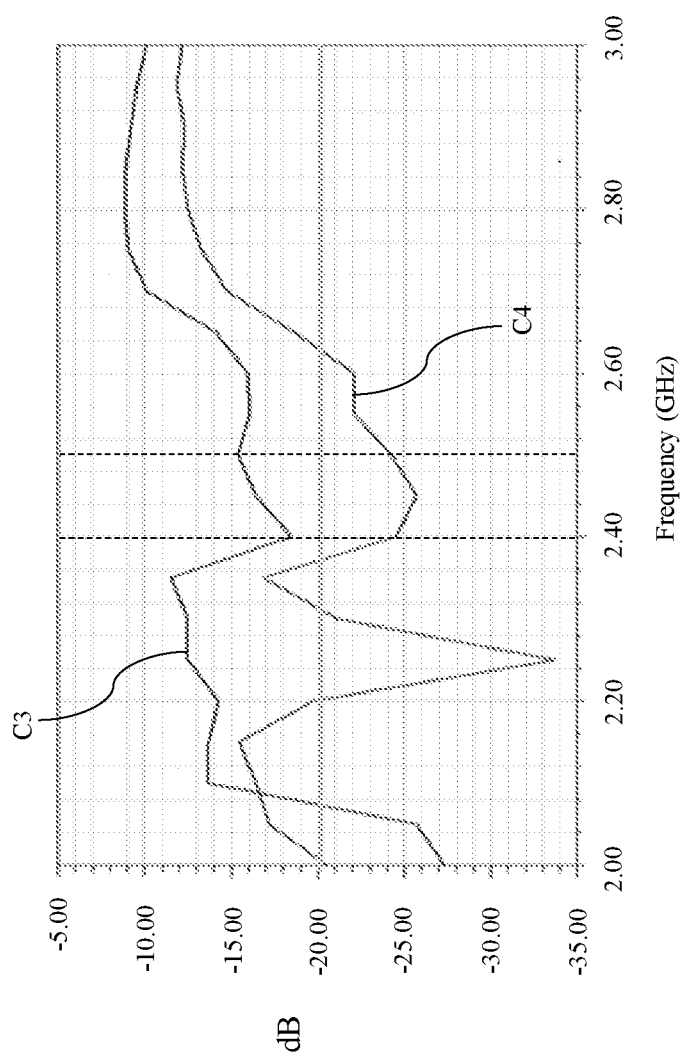
FIG. 6 is an experimental result of the third embodiment in accordance with the disclosure.

Please refer to FIG. 6, which is an experimental result of the third embodiment in accordance with the disclosure. The curve C3 shows the isolation of the printed antenna without the third metallic pin header 34c. The curve C4 shows the isolation of the printed antenna 3 with the third metallic pin header 34c. As shown in FIG. 6, the printed antenna 3 with the third metallic pin header 34c can obviously achieve greater isolation effect.

To sum up, according to one embodiment of the disclosure, the printed antenna has a metallic pin header, which can effectively improve the performance of the printed antenna and reduce the size of the printed antenna. Thus, a circuit board can be installed with a lot of the printed antennas, which can satisfy the requirements of massive MIMO system.

According to one embodiment of the disclosure, the metallic pin header and the radiator of the printed antenna can be connected to each other, and have a common feedline, which can achieve the desired technical effect without increasing the complexity of the printed antenna.

According to one embodiment of the disclosure, the metallic pin header of the printed antenna can effectively improve the performance of the printed antenna, so the printed antenna can be directly disposed at the center of a circuit board. Therefore, the printed antenna can effectively make the most of the area of the circuit board.

Also, according to one embodiment of the disclosure, when the metallic pin header is connected to the radiator of the printed antenna, the vertically polarized wave of the radiator can be effectively enhanced, which can prevent from high peak gain, and the gain pattern of the printed antenna can be easy to adjust.

Besides, according to one embodiment of the disclosure, when the metallic pin header is disposed at one side of the radiator but not contacting the radiator, the metallic pin header can enhance the polarized wave, in the direction away from the metallic pin header, of the radiator, so the gain pattern of the printed antenna can be easy to adjust.

Moreover, according to one embodiment of the disclosure, when being disposed between two radiators, the metallic pin header of the printed antenna can enhance the isolation between the radiators of the printed antenna, so the radiators do not interfere with each other. Thus, the performance of the printed antenna can be significantly improved.

Furthermore, according to one embodiment of the disclosure, the performance of the printed antenna can be improved by the metallic pin header of small size and low cost, so the printed antenna will not block the ventilation holes of electronic devices and will not increase the manufacturing cost thereof. Therefore, the printed antenna can be applied to various electronic devices, such as access point, router, etc.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An antenna with pin header, comprising:
a substrate;
a feed point, disposed on the substrate;
a radiator, printed on the substrate and connected to the feed point, wherein the radiator comprises a first portion, a second portion and a third portion, wherein the first portion is rectangular, the second portion is trapezoidal, the third portion is sectorial and the second portion is connected to the first portion and the third portion, wherein a recess is formed between the first portion, the second portion and the third portion; and
a metallic pin header, penetrating through the radiator and the substrate;
wherein the metallic pin header is connected to the feed point via the radiator, whereby the radiator and the metallic pin header have a common feedline, and the metallic pin header enhances a gain pattern, in a direction which the metallic pin header points in, of the radiator.

2. The antenna with pin header of claim 1, wherein the metallic pin header is perpendicular to the substrate.

3. The antenna with pin header of claim 1, wherein the metallic pin header is disposed at one end, most away from the feed point, of the radiator.

4. The antenna with pin header of claim 1, wherein the metallic pin header is disposed at one end, away from the second portion, of the first portion.

5. An antenna with pin header, comprising:
a substrate;
a feed point, disposed on the substrate;
a first radiator, printed on the substrate and connected to the feed point, wherein the first radiator comprises a first portion, a second portion and a third portion, wherein the first portion is rectangular, the second portion is trapezoidal, the third portion is sectorial and the second portion is connected to the first portion and the third portion, wherein a recess is formed between the first portion, the second portion and the third portion; and
a metallic pin header, penetrating through and the substrate and disposed at one side of the first radiator, but not contacting the first radiator, whereby the metallic pin header enhances the gain pattern, in a direction away from the metallic pin header, of the first radiator.

6. The antenna with pin header of claim 5, wherein the metallic pin header is perpendicular to the substrate.

7. The antenna with pin header of claim 5, wherein the first portion and the third portion extend in a direction away from the metallic pin header.

8. The antenna with pin header of claim 5, further comprising a second radiator, wherein the metallic pin header is disposed between the first radiator and the second radiator in order to enhance an isolation between the first radiator and the second radiator.

9. An electronic device, comprising a housing and a printed antenna disposed inside the housing, and the printed antenna comprising:
a substrate;
a feed point, disposed on the substrate;
a first radiator, printed on the substrate and connected to the feed point, wherein the first radiator comprises a first portion, a second portion and a third portion, wherein the first portion is rectangular, the second portion is trapezoidal, the third portion is sectorial and the second portion is connected to the first portion and the third portion, wherein a recess is formed between the first portion, the second portion and the third portion; and
a first metallic pin header, penetrating through the first radiator and the substrate;
wherein the first metallic pin header is connected to the feed point via the first radiator, whereby the first radiator and the first metallic pin header have a common feedline, and the first metallic pin header enhances a gain pattern, in a direction which the first metallic pin header points in, of the first radiator.

10. The electronic device of claim 9, wherein the first metallic pin header is perpendicular to the substrate.

11. The electronic device of claim 9, wherein the first metallic pin header is disposed at one end, most away from the feed point, of the first radiator.

12. The electronic device of claim 9, wherein the first metallic pin header is disposed at one end, away from the second portion, of the first portion.

13. The electronic device of claim 9, wherein the printed antenna further comprises a second metallic pin header penetrating through the substrate and disposed at one side of the first radiator, but not contacting the first radiator, whereby the second metallic pin header enhances a gain pattern, in a direction away from the second metallic pin header, of the first radiator.

14. The electronic device of claim 13, wherein the printed antenna further comprises a second radiator disposed between the first radiator and the second radiator in order to enhance an isolation between the first radiator and the second radiator, and a gain pattern, in a direction away from the second metallic pin header, of the second radiator.

* * * * *